(12) United States Patent
Greenfield et al.

(10) Patent No.: US 9,251,885 B2
(45) Date of Patent: Feb. 2, 2016

(54) THROTTLING SUPPORT FOR ROW-HAMMER COUNTERS

(71) Applicant: Intel Corporation, Santa Clara, CA (US)

(72) Inventors: Zvika Greenfield, Kfar Sava (IL); Tomer Levy, Tel Aviv (IL)

(73) Assignee: Intel Corporation, Santa Clara, CA (US)

(*) Notice: Subject to any disclaimer, the term of this patent is extended or adjusted under 35 U.S.C. 154(b) by 126 days.

(21) Appl. No.: 13/730,181

(22) Filed: Dec. 28, 2012

(65) Prior Publication Data

US 2014/0189228 A1 Jul. 3, 2014

(51) Int. Cl.
*G11C 11/406* (2006.01)
*G06F 13/16* (2006.01)

(52) U.S. Cl.
CPC ...... *G11C 11/40607* (2013.01); *G06F 13/1605* (2013.01); *G11C 11/40603* (2013.01); *G11C 11/40611* (2013.01)

(58) Field of Classification Search
CPC . G06F 12/00; G06F 11/3037; G06F 13/1605; G11C 16/3418; G11C 2211/00; G11C 11/40622; G11C 11/40607; G11C 11/40603; G11C 11/40611
USPC .......................................................... 711/106
See application file for complete search history.

(56) References Cited

U.S. PATENT DOCUMENTS

| | | | |
|---|---|---|---|
| 6,711,081 B1 * | 3/2004 | Jain ...................... | G11C 11/403 365/154 |
| 7,778,078 B2 * | 8/2010 | Nagadomi et al. ....... | 365/185.09 |
| 8,081,527 B1 * | 12/2011 | Venkataraman ......... | G11C 7/00 365/154 |
| 8,341,300 B1 * | 12/2012 | Karamcheti et al. ............. | 710/6 |
| 8,432,769 B2 | 4/2013 | Moon | |
| 2003/0037185 A1 | 2/2003 | Davis et al. | |

(Continued)

FOREIGN PATENT DOCUMENTS

WO WO-2014004748 1/2014

OTHER PUBLICATIONS

DDR4 Specification Publication date; Published Sep. 2012 by JEDEC; p. 1.*

(Continued)

*Primary Examiner* — Reginald Bragdon
*Assistant Examiner* — Paul Knight
(74) *Attorney, Agent, or Firm* — Blakely, Sokoloff, Taylor & Zafman LLP

(57) ABSTRACT

Throttling of memory access commands. Accesses to rows of a memory device are monitored for a timeframe. The timeframe is divided into at least two sub-frames. If the number of accesses for any of the rows during a first sub-frame exceeds a first threshold throttling accesses to the accessed row at a first rate. Not throttling accesses to the accessed row if the number of accesses to the accessed row does not exceed the first threshold. The first threshold is associated with risk of data corruption on a row physically adjacent to the accessed row. If a number of accesses for the accessed row during a second sub-frame exceeds a second threshold, throttling accesses to the accessed row at a second rate. Not throttling accesses to the accessed row if the number of accesses to the accessed row does not exceed the second threshold. The second threshold is greater than the first threshold. The second throttling rate is greater than the first throttling rate.

24 Claims, 5 Drawing Sheets

(56) References Cited

U.S. PATENT DOCUMENTS

| | | | |
|---|---|---|---|
| 2006/0004955 A1* | 1/2006 | Ware | G11C 11/406 711/106 |
| 2006/0069855 A1 | 3/2006 | Ha et al. | |
| 2008/0189588 A1* | 8/2008 | Tanaka et al. | 714/764 |
| 2010/0034024 A1 | 2/2010 | Mochizuki et al. | |
| 2010/0110810 A1 | 5/2010 | Kobayashi | |
| 2010/0142304 A1 | 6/2010 | Pyeon | |
| 2010/0208537 A1* | 8/2010 | Pelley et al. | 365/201 |
| 2011/0026353 A1 | 2/2011 | Mokhlesi | |
| 2011/0179248 A1* | 7/2011 | Lee | 711/171 |
| 2012/0124273 A1* | 5/2012 | Goss et al. | 711/103 |
| 2012/0278533 A1* | 11/2012 | Suzuki et al. | 711/103 |
| 2013/0086302 A1* | 4/2013 | Tressler et al. | 711/103 |
| 2014/0006703 A1* | 1/2014 | Bains et al. | 711/106 |
| 2014/0095780 A1* | 4/2014 | Bains et al. | 711/105 |

OTHER PUBLICATIONS

Fault Models for Embedded-DRAM Macros; Chao; Published 2009 by Chao Tung University, Taiwan p. 717.*

An Investigation into Crosstalk Noise in DRAM Structures; Redeker; Information Technology Laboratory University of Hanover; Published by IEEE 2002; p. 6.*

Alternate Hammering Test for Application-Specific DRAMs and an Industrial Case Study by Rei-Fu Huang; ACM Jun. 2012.*

Non-Final Office Action for U.S. Appl. No. 13/539,415 mailed Jul. 29, 2014, 9 pages.

Final Office Action for U.S. Appl. No. 13/539,415 mailed Dec. 29, 2014, 9 pages.

Notice of Allowance and Fees for U.S. Appl. No. 13/539,415 mailed May 22, 2015, 7 pages.

International Search Report and Written Opinion for PCT Patent Application No. PCT/US2013/048016 mailed Oct. 18, 2013, 9 pages.

* cited by examiner

THROTTLING SUPPORT FOR ROW-HAMMER COUNTERS

TECHNICAL FIELD

Embodiments of the invention are generally related to memory management. More particularly embodiments of the invention relate to monitoring for a row hammer event.

BACKGROUND

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With the latest generation of increased density, intermittent failure has appeared in some devices. For example, some existing DDR3 based systems experience intermittent failures with heavy workloads. Researchers have traced the failures to repeated access to a single row of memory within the refresh window of the memory cell. For example, for a 32 nm process, if a row is accessed 550K times or more in the 64 millisecond refresh window, the physically adjacent wordline to the accessed row has a very high probability of experiencing data corruption. The row hammering or repeated access to a single row can cause migration across the passgate. The leakage and parasitic currents caused by the repeated access to one row cause data corruption in a non-accessed physically adjacent row. The failure issue has been labeled as a 'row hammer' or '1 row disturb' issue by the DRAM industry where it is most frequently seen.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
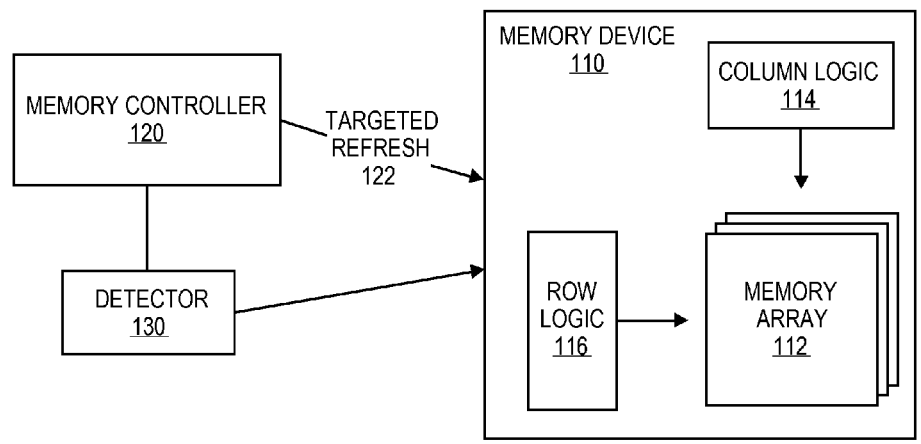
FIG. 1 is a block diagram of an embodiment of a system that monitors for a row hammer condition.

In the following description, numerous specific details are set forth. However, embodiments of the invention may be practiced without these specific details. In other instances, well-known circuits, structures and techniques have not been shown in detail in order not to obscure the understanding of this description.

As described herein, a system monitors data accesses to specific rows of memory to determine if a row hammer condition exists. The monitoring can be broken down into tracking the count for the most active rows, and not necessarily tracking every single row of memory in the system. The system can monitor accessed rows of memory to determine if the number of accesses to any of the rows exceeds a threshold associated with risk of data corruption on a row of memory physically adjacent to the row with high access. The threshold is the row hammer condition threshold. Based on the monitoring, a memory controller can determine if the number of accesses to a row exceeds the threshold, and indicate address information for the row whose access count reaches the threshold.

A specific row of a memory device can be the target of repeated accesses. When the row is accessed repeatedly within a time threshold (also referred to as "hammered" or a "row hammer event"), a physically adjacent row or rows (a "victim" row) may experience data corruption. To address the row hammer event with a runtime operation, the memory controller can monitor the number of activations of each row in the memory subsystem within a time window to determine when a row hammer event occurs. In one embodiment, the memory controller triggers a targeted refresh on a physically adjacent row or rows to the row determined to be hammered.

However, computing systems can use up to 8 GB of memory, with projections of up to 64 GB of memory in consumer client devices in the near future, and with server devices including much larger amounts of memory. Thus, to monitor every row of memory, the memory controller could be required to monitor, for example, at least up to 1-8 million counters, requiring between 3-32 MB of counters memory on die. Thus, the straightforward monitoring solution (monitoring each row separately), is prohibitive in terms of the cost.

As discussed above. row-hammer monitoring generally requires a very large number of counters, which increases as the row-hammer limit rate decreases and the row activation request (ACT) signal rate increases. One problem arises when the row-hammer limits is lower than the design targeted. The techniques described herein operate on top of the row-hammer monitoring to extend the functionality for lower row-hammer limits. In one embodiment, throttling is utilized, but does not begin at the beginning of the timeframe, but at a later stage. In one embodiment, the throttling level is adjusted based on previous ACT budget utilization without causing a complete stall.

The examples provided herein primarily discuss the row hammer monitoring with respect to DRAM. However, the row hammer issue is more generally a memory device scaling issue, which occurs as memory densities increase. Thus, the descriptions with respect to DRAM are non-limiting examples that can be applied to other memory technologies that include memory controller or equivalent logic. Row hammer monitoring described herein is compatible with any of a number of memory technologies, such as DDR4 (dual data rate version 4, specification in development as of the filing of this application), LPDDR4 (low power dual data rate version 4, specification in development as of the filing of this application), or WIDEIO (specification in development as of the filing of this application).

FIG. 1 is a block diagram of an embodiment of a system that monitors for a row hammer condition. System 100 includes memory device 110 coupled to memory controller 120. Memory device 110 can include any type of memory technology that has adjacent rows of memory cells, where data is accessible via a wordline or the equivalent. In one embodiment, memory device 110 includes dynamic random access memory (DRAM) technology.

Memory device 110 includes memory array 112, which represents one or more logical and/or physical groups of memory. An example of a grouping of memory is a bank of memory. While not specifically shown in system 100, memory array 112 can include one or more rows that are the targets of repeated access within a time window. Such a row is subject to a row hammer condition. In many modern memory devices, the architecture of the semiconductor layout causes one or more physically adjacent rows to be at risk of becoming corrupted. The row or rows at risk of becoming corrupted due to row hammer condition are referred to herein as victim rows.

Memory device 110 includes column logic 114 and row logic 116, which are used to decode an access instruction to the proper memory location within memory array(s) 112. There is no requirement for the number of rows and columns to be equal, and in fact they are typically not equal. Memory controller 120 sends commands or instructions to memory device 110 over a command bus (e.g., a command/address (C/A) bus), which are then interpreted by memory device 110.

Memory device 110 decodes the command information to perform a variety of access functions within the memory, and decodes address information via column logic 114 and row logic 116. The logic accesses a specific location in memory with a combination of a column address strobe or signal (CAS) and a row address strobe or signal (RAS). Rows of memory can be implemented in accordance with known memory architectures or their derivatives. Briefly, a row of memory includes one or more addressable columns of memory cells, as identified by the CAS generated by column logic 114. The rows are addressable via the RAS generated by row logic 116.

System 100 includes detector 130, which represents hardware and/or software or other logic that enables system 100 to detect a row hammer event or row hammer condition. There can be multiple different mechanisms used to detect the row hammer condition. As specifically described herein, system 100 detects a row hammer condition via detector 130, which includes a table or log to monitor accesses to selected rows of memory. Thus, detector 130 can determine when a row of memory array 112 experiences repeated accesses within a threshold time period. Detector 130 can include hardware and/or logic at memory device 110, memory controller 120, and/or separate from either the memory device or the memory controller.

Detector 130 determines a number of times a row is access within a time period. A row hammer event is not simply about how many times a row is accessed, but how many times in a given time period. Once a row is refreshed, the conditions that could cause data corruption are overcome. Thus, the time period for the monitoring can be based at least in part on the refresh rate. In one embodiment, the time period during which detector 130 monitors for a threshold number of accesses is equal to the refresh cycle time of memory device 110.

In one embodiment, memory controller 120 generates targeted refresh command 122 to cause the memory controller to perform a targeted refresh in response to detecting a row hammer event. Targeted refresh command 122 is a refresh command that occurs "off-schedule," meaning that the command is sent in response to detecting the row hammer event as opposed to sending command because a timer indicates it is time to perform a refresh. In one embodiment, memory controller 120 doubles up an existing command to send a targeted refresh command, such as examples described in co-pending patent application Ser. No. 13/539,415, entitled, "Row Hammer Refresh Command," filed concurrently herewith.

For example, targeted refresh command 122 could be doubled up with either an Activate or a Refresh command as defined for DRAM (dynamic random access memory). The memory controller can accomplish the doubling up, for example, by use of another pin and/or a Mode Register state that can cause the memory device to interpret a command as a targeted refresh instead of the Activate or (standard) Refresh commands.

Memory controller 120 provides address information to indicate the hammered row. Detector 130 can indicate address information identifying the row, which memory controller 120 can indicate to memory device 110 to cause the memory device to determine what victim row(s) should be refreshed. The address can be indicated to the memory device specifically, or can be provided more generally. Thus, when detector 130 determines that a specific row of memory is subject to a row hammer condition (accesses have reached or exceeded a threshold), it indicates the row to memory controller 120, which in turn can send a targeted refresh command.

When referring to targeted refresh command 122, different memory device manufacturers may use different logic and architectures to utilize the memory resources of the devices. For example, different memory device manufacturers can use different offsets to map between logical memory addresses used in the host processor (not shown) and the physical memory addresses used internally to memory device 110.

In one embodiment, memory controller 120 utilizes the same logical memory addresses as used by the host processor. Thus, in one embodiment, memory controller 120 provides a row address to memory device 110 indicating the hammered row. The memory controller can indicate the row address in conjunction with and/or as part of a command that it issues to memory device 110. The memory device can then compute the specific address or addresses of any victim row(s). Memory device 110 then performs a targeted refresh on the physically adjacent, victim row(s).

As described in more detail below, detector 130 includes configuration to set the timeframe for which it is to monitor for a row hammer condition, as well as configuration to set the number of accesses that define a row hammer event that would cause the memory controller to trigger a targeted refresh. Detector 130 maintains data for a subset of the total number of rows in system 100. In one embodiment, detector 130 maintains data for a number of rows based on MVC, which is the maximum victim count expected for the configured timeframe. For example, detector 130 can keep a table with MVC+1 entries, or more entries. Detector 130 can then roll entries into the table for memory locations that are accessed, rolling out the lowest-count entries in the table to replace them.

Figure 2:
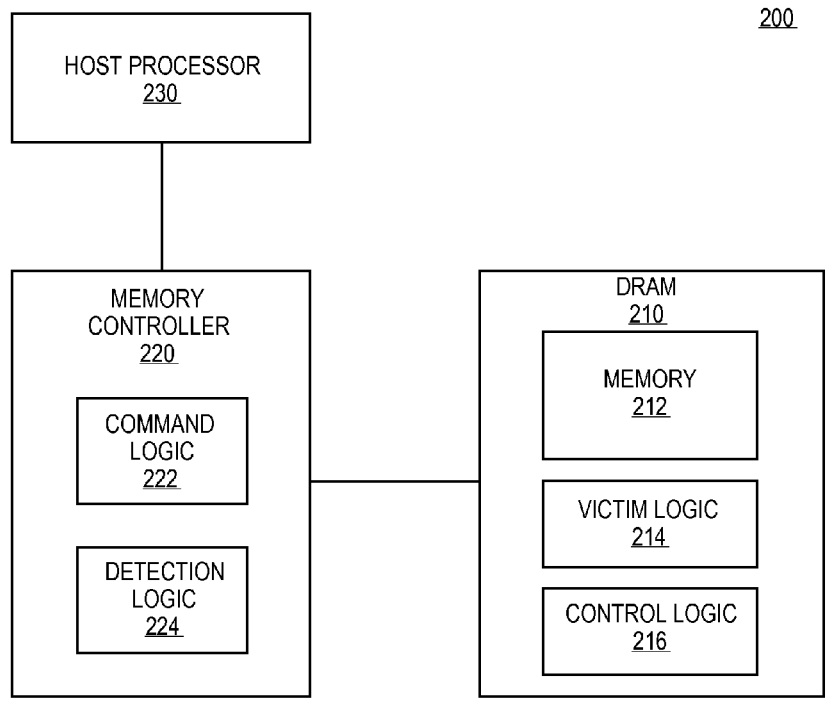
FIG. 2 is a block diagram of an embodiment of a system that monitors for a row hammer condition based on memory controller access commands.

FIG. 2 is a block diagram of an embodiment of a system that monitors for a row hammer condition based on memory controller access commands. System 200 is a system that includes a memory device coupled to host processor 230 via memory controller 220, and can be one example of a system in accordance with system 100 of FIG. 1. System 200 includes memory device DRAM 210 coupled to memory controller 220. Memory controller 220 is coupled in turn to host processor 230.

Host processor 230 can be any type of processing unit, processor, or microcontroller. Host processor 230 performs the primary execution of operations in system 200. Operations executed by host processor 230 typically originate from instructions and data stored in DRAM 210. DRAM 210 is a memory device in accordance with any embodiment described herein. DRAM 210 includes memory cells 212, which store the data and instructions used by host processor 230. In one embodiment, DRAM 210 is a volatile memory, or a memory device whose contents are non-deterministic if power is interrupted to the device. Thus, a volatile memory requires a regular power source to allow it to refresh the memory cells to keep the data from become lost or corrupted.

DRAM 210 includes hardware connectors that interface with corresponding hardware connectors of memory controller 220. Memory access from host processor 230 typically goes through memory controller 220. In one embodiment, memory controller 220 is part of host processor 230. In an alternate embodiment, memory controller is part of a supporting "chipset" or hardware logic that provides an infrastructure for power and interface logic for a hardware platform of which host processor 230 is a part.

As mentioned above, a detector enables memory controller 220 to identify a row hammer condition to be able to respond to the row hammer condition with a targeted refresh command. Detection logic 224 is illustrated as being part of memory controller 220, and represents some or all of the logic needed to detect row hammering in system 200. Memory controller 220 includes command logic 222, which represents hardware and software or other logic to enable memory controller 220 to perform its functions of managing memory access to DRAM 210.

DRAM 210 includes victim logic 214, which represents logic to determine what row or rows are at risk of corruption due to the row hammer condition. In one embodiment, victim logic 214 can be at least partially executed at memory controller 220. However, for the sake of broader interoperability between memory controller 220 and other types of memory devices, victim logic 214 generally resides at DRAM 210. Thus, memory controller 220 need only identify the fact that a row hammer condition exists, and then send a command specifying the address or address range of the target row. DRAM 210 can then use a map or other logic to determine what row or rows are potential victims.

DRAM 210 includes control logic 216, which includes logic to perform refresh of memory 212. Each memory device includes some logic to keep track of what memory cells have been refreshed, and what rows are next due for a refresh. Control logic 216 can implement the actual targeted refresh based on receiving a targeted refresh command from memory controller 220.

Figure 3:
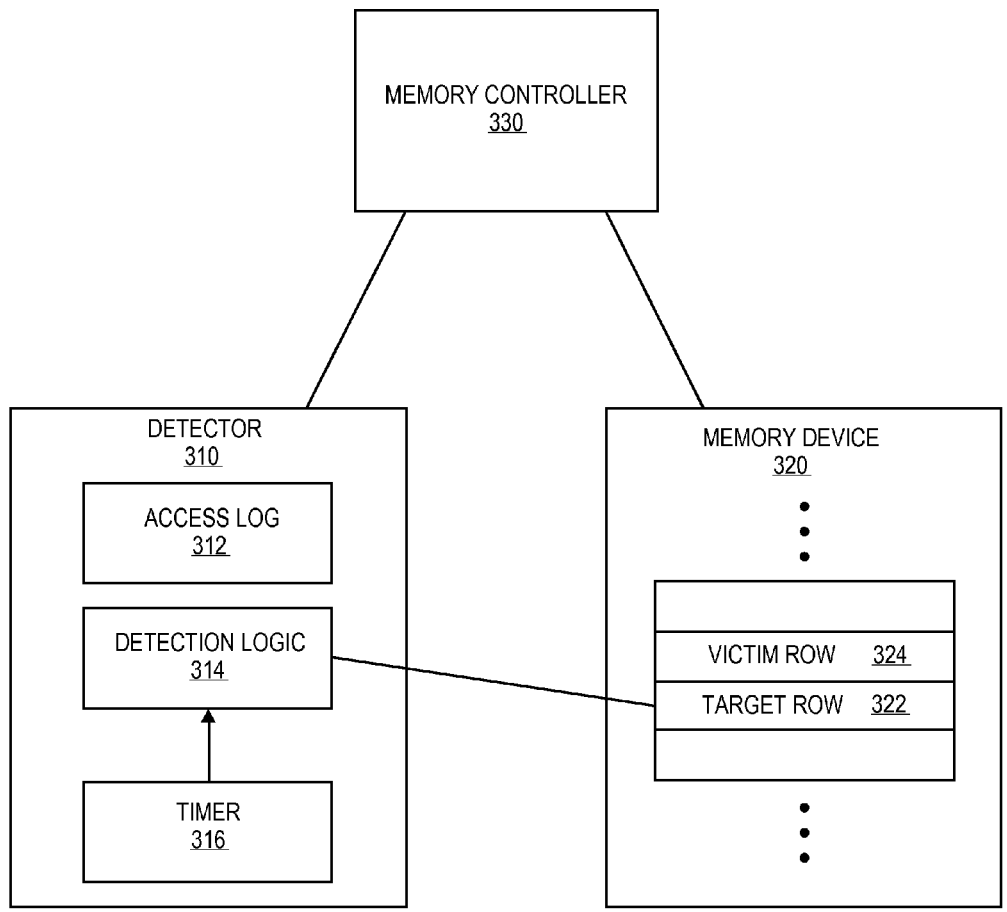
FIG. 3 is a block diagram of an embodiment of a system that uses an access log to monitor for a row hammer condition.

FIG. 3 is a block diagram of an embodiment of a system that uses an access log to monitor for a row hammer condition. System 300 represents an example of a system that includes a memory subsystem with memory controller 330, memory device 320, and detector 310. System 300 provides one example of a system in accordance with system 100 of FIG. 1 or system 200 of FIG. 2. In one embodiment, detector 310 is part of memory controller 330. Memory controller 330 can issue a targeted refresh command in response to detection of a row hammer condition by detector 310.

Memory device 320 includes multiple rows of memory. Among the rows is target row 322, which is a row that is the target of repeated access within a time period. Victim row 324 is a row that is at risk of data corruption due to the hammering of target row 322. There can be more than one victim row associated with a hammered row (e.g., each row physically adjacent to the hammered row).

In one embodiment, detector 310 include access log 312. Access log 312 can be implemented as a list or array or table or other logical structure that stores entries having multiple fields of information. Each entry includes at least an address or identifier for a specific row of memory and an access count for the entry. The number of entries in access log 312 is much smaller than the total number of rows in memory device 320. Thus, detector 310 monitors keeps a count for a subset of all rows. The count of each row can be incremented as the row is accessed again, and the count can be compared to the threshold to determine if the row has been accessed the threshold number of times.

Detection logic 314 includes logic to enable detector 310 to determine that an access command is directed to a row of memory. While detection logic 314 is shown specifically with a line to target row 322, detection logic 314 can monitor accesses to any row. In one embodiment, detection logic 314 includes a mechanism to determine an address of an Activate command issued by memory controller 330. Thus, every time memory controller 330 sends a command for memory device 320 to activate a row of memory, detector 310 can identify the address associated with the command, and keep track of access for the address in access log 312.

Detector 310 determines when access to a row exceeds a threshold, and indicates the row address information to the memory controller. The address information in access log 312 is not necessarily the same address used by memory device 320 to access the physical memory resources. Memory device 320 decodes the addresses sent by memory controller 330 to physical resources. Thus, when detector 310 identifies a row for which accesses have reach or exceeded the threshold, the information may still need to be decoded to identify physical resources of target row 322 so that physically adjacent victim row 324 can be identified.

Detector 310 receives timer information 316, through which detector 310 can identify the start of a timeframe, as well as the end of a timeframe. The monitoring takes place between the timeframe. In one embodiment, the timeframe goes from one scheduled refresh to the next.

In one embodiment, detector 310 clears the count of an entry in access log 312 when the entry reaches the threshold and is identified to the memory controller. Detection can be performed on a rank and/or bank granularity. There is not necessarily a single detector 310 for the memory controller. Each bank can be tracked, and each memory channel can have monitoring.

By limiting the number of ACT commands executed in the row-hammer timeframe, the number of counters needed in the row-hammer monitoring solution can be limited. However, simple throttling can be problematic for various reasons. For example, if the throttling takes place in the early portion of the timeframe, performance losses may be significant even in the cases when later in the timeframe, the ACT rate is lower and throttling is not required. If throttling takes place in the later portion of the timeframe, it may cause a stall until the end of the timeframe, which is undesirable for system performance.

In one embodiment, the timeframe is divided into multiple sub-frames. In one embodiment, there is no throttling during a first sub-frame and throttling can be increased for subsequent sub-frames. For example, to throttle one ACT command every ten cycles in a timeframe of 1 millisecond (e.g., 1,000 cycles), the maximum in the timeframe is 100 ACT commands. In this example, the timeframe is divided into three sub-frames.

For the first 250 microseconds an unlimited number of ACT commands can be allowed (assume maximum of 1 ACT every 5 cycles). This may use up to one half of the ACT budget for the whole timeframe (50 ACT commands). For the next 250 microseconds, one ACT command is allowed for every 10 cycles, if the average ACT rate since the beginning of the timeframe is greater. Throttling takes place only if the average rate since the beginning of the timeframe is 3 ACT commands every 20 cycles. For the next 500 microseconds, one ACT command is allowed every 20 cycles if the average rate sconce the beginning of the time frame is one ACT command every 10 cycles. Utilizing this technique, there is always forward progress and if the budget has not been used in a certain part of the timeframe, there is no throttling later. If the budget has been used for a previous part of the timeframe, throttling will take place only to the required level.

Figure 4:
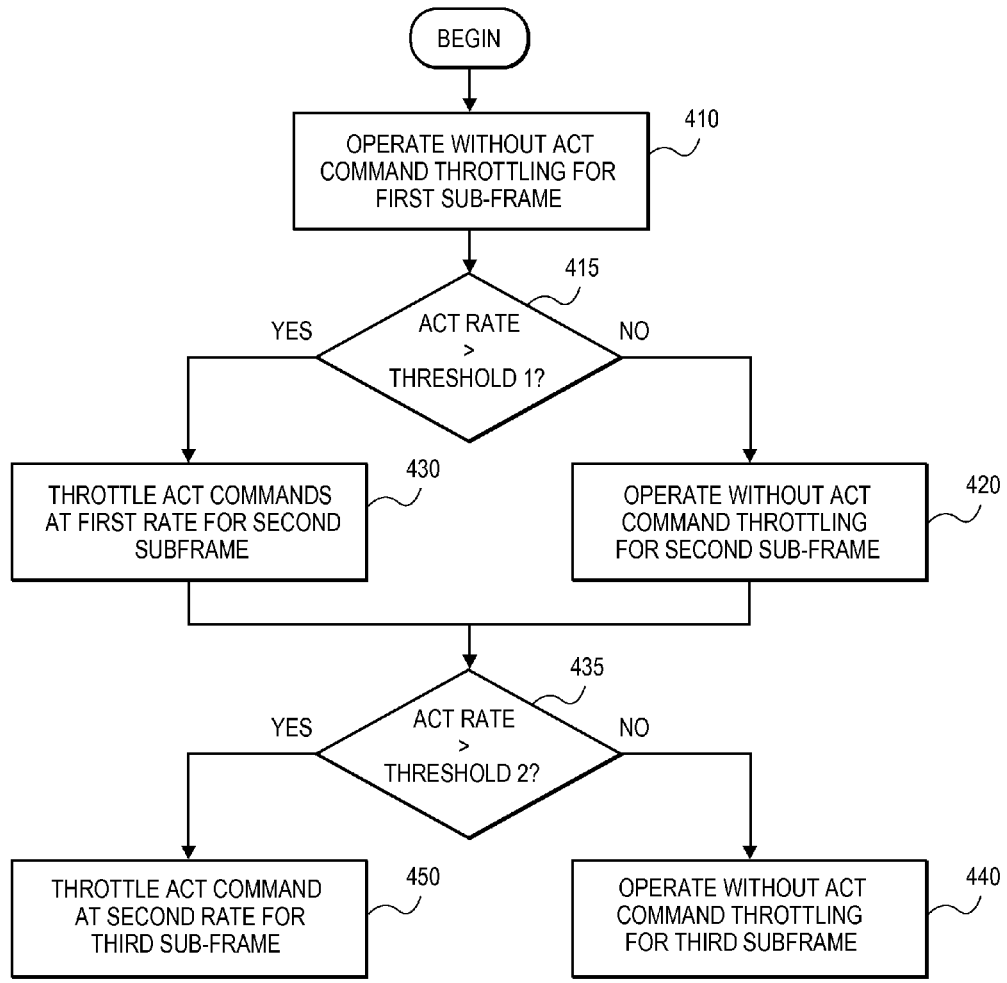
FIG. 4 is a flow diagram of one embodiment of a technique for throttling support with row-hammer counters.

FIG. 4 is a flow diagram of one embodiment of a technique for throttling support with row-hammer counters. The example of FIG. 4 follows the example above with a timeframe including three sub-frames; however, any number of sub-frames can be supported. Alternate embodiments, for example, can have two, four, five, eight sub-frames during which throttling may be different or adjusted.

The memory device operates with no throttling during a first sub-frame, 410. In one embodiment, the first sub-frame is half of the timeframe; however, other configurations can also be supported. For example, the sub-frames may represent even time divisions (e.g., three sub-frames each being one-third of the time frame), or other uneven divisions may be used.

If the ACT rate exceeds a first threshold value during the first sub-frame, 415, ACT commands are throttled for the second sub-frame, 430. If the ACT rate does not exceed the first threshold value, 415, ACT commands are allowed to proceed without throttling during the second sub-frame, 420.

If the ACT rate exceeds a second threshold value during the second sub-frame, 435, ACT commands are throttled for the third sub-frame, 450. If the ACT rate does not exceed the first threshold value, 435, ACT commands are allowed to proceed without throttling during the second sub-frame, 440. In one embodiment, the second threshold is greater than the first threshold. In alternate embodiments, the second threshold is less than the first threshold.

As described above, the rate at which the ACT command budget is being consumed is a factor in the level of throttling applied. In one embodiment, the throttling during the third sub-frame is greater (i.e., more aggressive) than the throttling during the second sub-frame. In one embodiment, the throttling during the third sub-frame is less than (i.e., less aggressive) than the throttling during the second sub-frame.

Figure 5:
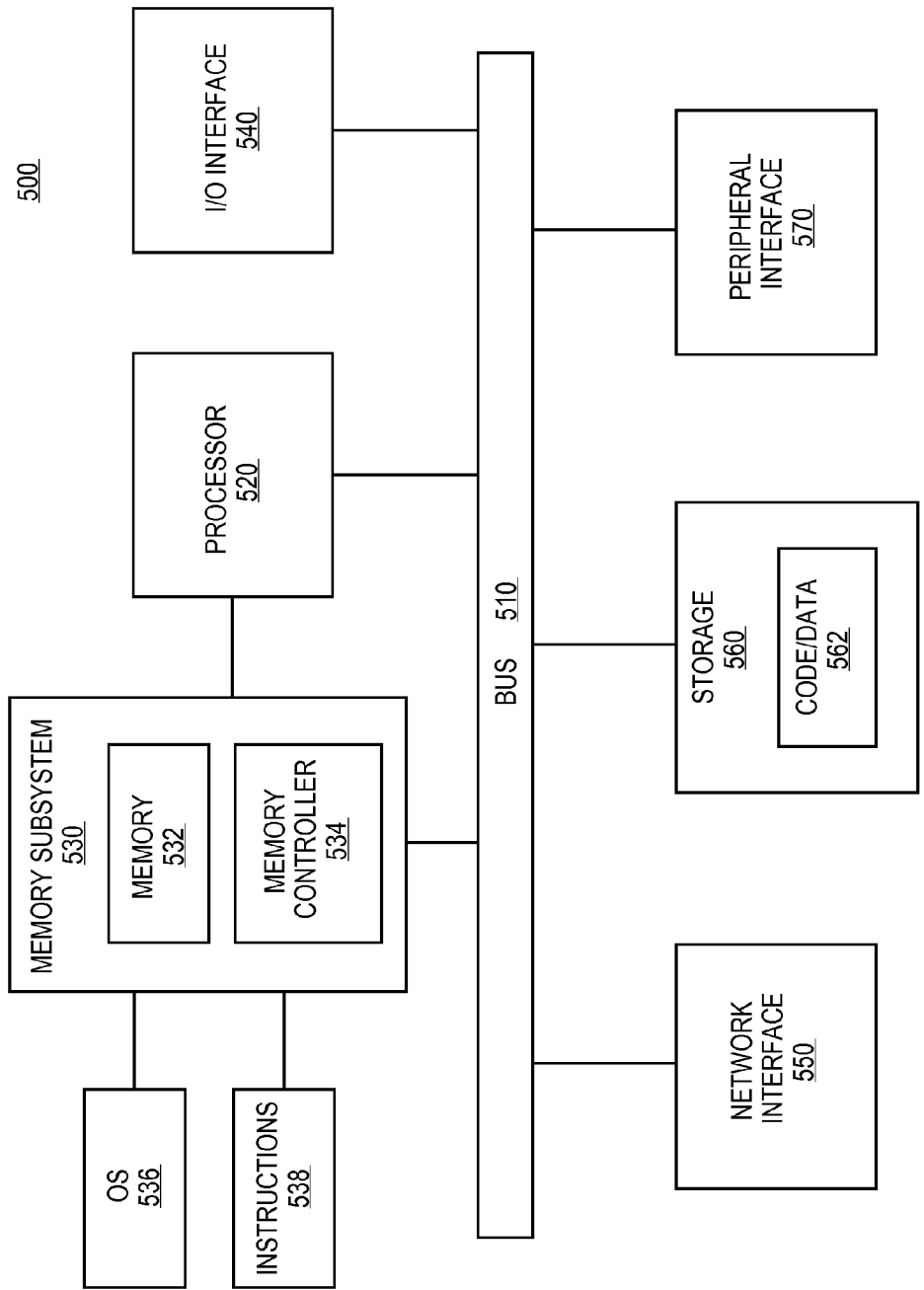
FIG. 5 is a block diagram of an embodiment of a computing system in which row hammer monitoring can be implemented.

FIG. 5 is a block diagram of an embodiment of a computing system in which row hammer monitoring can be implemented. System 500 represents a computing device in accordance with any embodiment described herein, and can be a laptop computer, a desktop computer, a server, tablet, a gaming or entertainment control system, a scanner, copier, printer, or other electronic device. System 500 includes processor 520, which provides processing, operation management, and execution of instructions for system 500.

Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 includes memory device 532 where it stores data, instructions, programs, or other items. In one embodiment, memory subsystem includes memory controller 534, which is a memory controller in accordance with any embodiment described herein, and which provides row hammer condition monitoring. In one embodiment, memory controller 534 provides a targeted refresh command to memory device 532 based on the detected row hammer condition. The targeted refresh command causes memory device 532 to perform a targeted refresh, which is a refresh operation off-cycle, meaning it is not on the regularly scheduled cycle of refreshes, and is not necessarily on an area tracked by the memory device as the next area to refresh. Rather, the row or region refreshed is based on a victim row or region identified based on an address associated with the targeted refresh command.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

Figure 6:
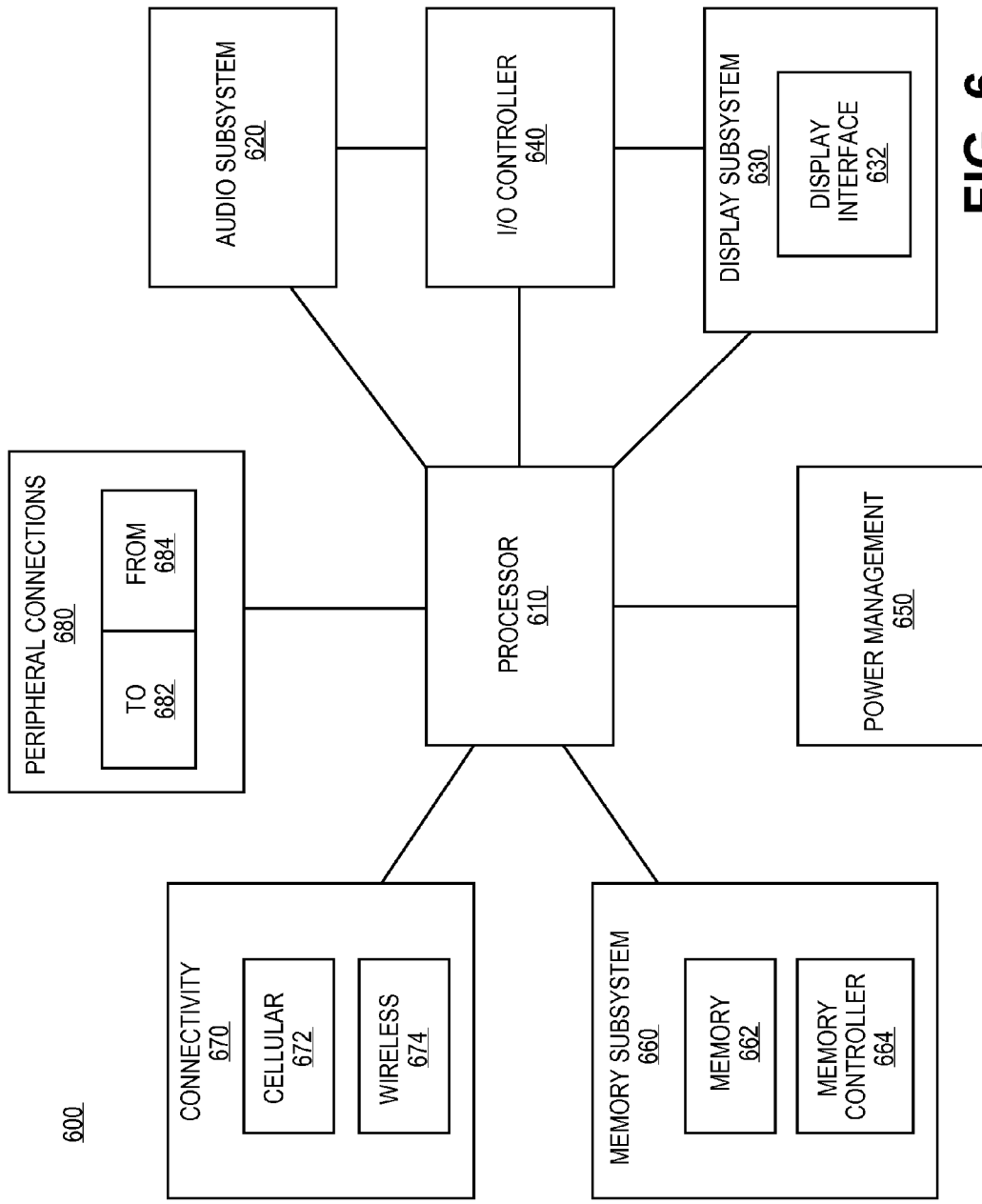
FIG. 6 is a block diagram of an embodiment of a mobile device in which row hammer monitoring can be implemented.

FIG. 6 is a block diagram of an embodiment of a mobile device in which row hammer monitoring can be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. In one embodiment, processor 610 includes optical interface components in addition to a processor die. Thus, the processor die and photonic components are in the same package. Such a processor package can interface optically with an optical connector in accordance with any embodiment described herein.

The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 monitors for a row hammer condition. For example, memory controller 664 can monitor the requests to certain memory addresses, and log how many times a specific address is the subject of a request. The memory controller can track only the highest-accessed addresses by rolling the addresses in and out of a log or table used to track the number of accesses.

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, access to rows of a memory device is monitored for a timeframe, wherein the timeframe is divided into at least two sub-frames. A determination is made whether a number of accesses for any of the rows during a first sub-frame exceed a first threshold. The first threshold associated with risk of data corruption on a row physically adjacent to the accessed row. Accesses to the accessed row are throttled at a first rate if the number of accesses to the accessed row exceeds the first threshold and not throttling accesses to the accessed row if the number of accesses to the accessed row does not exceed the first threshold. A determination is made whether a number of accesses for the accessed row during a second sub-frame exceed a second threshold. The second threshold is greater than the first threshold. Accesses to the accessed row are throttled at a second rate if the number of accesses to the accessed row exceeds the second threshold and not throttling accesses to the accessed row if the number of accesses to the accessed row does not exceed the second threshold. The second throttling rate is greater than the first throttling rate.

In one embodiment, monitoring the accesses for the timeframe comprises monitoring accesses for a time period equal to a refresh cycle time for the memory device. In one embodiment, the at least two sub-frames comprise three sub-frames where no throttling is performed during a first sub-frame, the first rate of throttling is selectively applied during a second sub-frame, and the second rate of throttling is selectively applied during a third sub-frame. In one embodiment, the first sub-frame comprises a first half of the timeframe, the second sub-frame comprises one quarter of the timeframe, and the third sub-frame comprises one quarter of the timeframe. In one embodiment, the first sub-frame comprises a first quarter of the timeframe, the second sub-frame comprises one quarter of the timeframe, and the third sub-frame comprises a last half of the timeframe.

In one embodiment, monitoring the accesses further comprises maintaining a table of access counts to monitor the accesses, and comparing the access counts to the first threshold and the second threshold. In one embodiment, the memory device conforms to a double data rate (DDR) standard. In one embodiment, the DDR standard comprises a DDR-4 standard.

In one embodiment, a memory device has multiple rows of memory. A memory controller is coupled to the memory device. The memory controller monitors access to rows of a memory device for a timeframe. The timeframe is divided into at least two sub-frames. If a number of accesses for any of the rows during a first sub-frame exceeds a first threshold, the first threshold associated with risk of data corruption on a row physically adjacent to the accessed row, accesses to the accessed row are throttled at a first rate if the number of accesses to the accessed row exceeds the first threshold and not throttling accesses to the accessed row if the number of accesses to the accessed row does not exceed the first threshold. If a number of accesses for the accessed row during a second sub-frame exceeds a second threshold, wherein the second threshold is greater than the first threshold, accesses to the accessed row are throttled at a second rate if the number of accesses to the accessed row exceeds the second threshold and not throttling accesses to the accessed row if the number of accesses to the accessed row does not exceed the second threshold. The second throttling rate is greater than the first throttling rate.

In one embodiment, monitoring the accesses for the timeframe comprises monitoring accesses for a time period equal to a refresh cycle time for the memory device. In one embodiment, the at least two sub-frames comprise three sub-frames where no throttling is performed during a first sub-frame, the first rate of throttling is selectively applied during a second sub-frame, and the second rate of throttling is selectively applied during a third sub-frame. In one embodiment, the first sub-frame comprises a first half of the timeframe, the second sub-frame comprises one quarter of the timeframe, and the third sub-frame comprises one quarter of the timeframe. In one embodiment, the first sub-frame comprises a first quarter of the timeframe, the second sub-frame comprises one quarter of the timeframe, and the third sub-frame comprises a last half of the timeframe.

In one embodiment, a memory device has multiple rows of memory. A memory controller is coupled to the memory device. The memory controller monitors access to rows of a memory device for a timeframe. The timeframe is divided into at least two sub-frames. If a number of accesses for any of the rows during a first sub-frame exceeds a first threshold, the first threshold associated with risk of data corruption on a row physically adjacent to the accessed row, accesses to the accessed row are throttled at a first rate if the number of accesses to the accessed row exceeds the first threshold and not throttling accesses to the accessed row if the number of accesses to the accessed row does not exceed the first threshold. If a number of accesses for the accessed row during a second sub-frame exceeds a second threshold, wherein the second threshold is greater than the first threshold, accesses to the accessed row are throttled at a second rate if the number of accesses to the accessed row exceeds the second threshold and not throttling accesses to the accessed row if the number of accesses to the accessed row does not exceed the second threshold. The second throttling rate is greater than the first throttling rate. A multicore processor is coupled with the memory subsystem to access the memory subsystem during execution.

In one embodiment, monitoring the accesses for the timeframe comprises monitoring accesses for a time period equal to a refresh cycle time for the memory device. In one embodiment, the at least two sub-frames comprise three sub-frames where no throttling is performed during a first sub-frame, the first rate of throttling is selectively applied during a second sub-frame, and the second rate of throttling is selectively applied during a third sub-frame. In one embodiment, the first sub-frame comprises a first half of the timeframe, the second sub-frame comprises one quarter of the timeframe, and the third sub-frame comprises one quarter of the timeframe. In one embodiment, the first sub-frame comprises a first quarter of the timeframe, the second sub-frame comprises one quarter of the timeframe, and the third sub-frame comprises a last half of the timeframe.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
monitoring access to rows of a memory device for a timeframe, wherein the timeframe is divided into at least two sub-frames each having a respective predefined duration, and wherein the timeframe corresponds to a time period between two scheduled refresh commands;
determining if a number of accesses for any of the rows during a first sub-frame of the at least two sub-frames exceeds a first threshold, the first threshold associated with risk of data corruption on a row physically adjacent to an accessed row;
throttling accesses to the accessed row at a first rate if the number of accesses to the accessed row exceeds the first threshold and not throttling accesses to the accessed row at the first rate if the number of accesses to the accessed row does not exceed the first threshold;
determining if a number of accesses for the accessed row during a second sub-frame of the at least two sub-frames exceeds a second threshold, wherein the second threshold is greater than the first threshold;
throttling accesses to the accessed row at a second rate if the number of accesses to the accessed row exceeds the second threshold and not throttling accesses to the accessed row at the second rate if the number of accesses to the accessed row does not exceed the second threshold, wherein the second throttling rate is greater than the first throttling rate; and
generating a targeted refresh with a refresh command, other than either of the two scheduled refresh commands, to refresh only the row physically adjacent to the accessed row in response to one of the number of accesses for the accessed row during the first sub-frame exceeding the first threshold and the number of accesses for the accessed row during the second sub-frame exceeding the second threshold.

2. The method of claim 1, wherein monitoring the accesses for the timeframe comprises monitoring accesses for a time period equal to a refresh cycle time for the memory device.

3. The method of claim 1 wherein the at least two sub-frames comprise three sub-frames where no throttling is performed during a first sub-frame, the first rate of throttling is selectively applied during a second sub-frame, and the second rate of throttling is selectively applied during a third sub-frame.

4. The method of claim 3 wherein the first sub-frame comprises a first half of the timeframe, the second sub-frame comprises one quarter of the timeframe, and the third sub-frame comprises one quarter of the timeframe.

5. The method of claim 3 wherein the first sub-frame comprises a first quarter of the timeframe, the second sub-frame comprises one quarter of the timeframe, and the third sub-frame comprises a last half of the timeframe.

6. The method of claim 1, wherein monitoring the accesses further comprises maintaining a table of access counts to monitor the accesses, and comparing the access counts to the first threshold and the second threshold.

7. The method of claim 1 wherein the memory device conforms to a double data rate (DDR) standard.

8. The method of claim 7 wherein the DDR standard comprises a DDR-4 standard.

9. A memory subsystem comprising:
a memory controller coupled to the memory device, the memory controller to: monitor access to rows of a memory device for a timeframe, wherein the timeframe is divided into at least two sub-frames each having a respective predefined duration, and wherein the timeframe corresponds to a time period between two scheduled refresh commands;
determine if a number of accesses for any of the rows during a first sub-frame of the at least two sub-frames exceeds a first threshold, the first threshold associated with risk of data corruption on a row physically adjacent to an accessed row;
throttle accesses to the accessed row at a first rate if the number of accesses to the accessed row exceeds the first threshold and not throttle accesses to the accessed row at the first rate if the number of accesses to the accessed row does not exceed the first threshold;
determine if a number of accesses for the accessed row during a second sub-frame of the at least two sub-frames exceeds a second threshold, wherein the second threshold is greater than the first threshold;
throttle accesses to the accessed row at a second rate if the number of accesses to the accessed row exceeds the second threshold and not throttle accesses to the accessed row at the second rate if the number of accesses to the accessed row does not exceed the second threshold, wherein the second throttling rate is greater than the first throttling rate; and
generate a targeted refresh with a refresh command, other than either of the two scheduled refresh commands, to refresh only the row physically adjacent to the accessed row in response to one of the number of accesses for the accessed row during the first sub-frame exceeding the first threshold and the number of accesses for the accessed row during the second sub-frame exceeding the second threshold.

10. The memory subsystem of claim 9, wherein the memory controller to monitor access for the timeframe comprises the memory controller to monitor accesses for a time period equal to a refresh cycle time for the memory device.

11. The memory subsystem of claim 9 wherein the at least two sub-frames comprise three sub-frames where no throttling is performed during a first sub-frame, the first rate of throttling is selectively applied during a second sub-frame, and the second rate of throttling is selectively applied during a third sub-frame.

12. The memory subsystem of claim 11 wherein the first sub-frame comprises a first half of the timeframe, the second sub-frame comprises one quarter of the timeframe, and the third sub-frame comprises one quarter of the timeframe.

13. The memory subsystem of claim 11 wherein the first sub-frame comprises a first quarter of the timeframe, the second sub-frame comprises one quarter of the timeframe, and the third sub-frame comprises a last half of the timeframe.

14. The memory subsystem of claim 9, wherein the memory controller to monitor access further comprises the memory controller to maintain a table of access counts to monitor the accesses, and comparing the access counts to the first threshold and the second threshold.

15. The memory subsystem of claim 9 further comprising a the memory device that conforms to a double data rate (DDR) standard.

16. The memory subsystem of claim 15 wherein the DDR standard comprises a DDR-4 standard.

17. An electronic device comprising:
a memory subsystem having
a memory device having multiple rows of memory, and
a memory controller coupled to the memory device, the memory controller to:
monitor access to rows of a memory device for a timeframe, wherein the timeframe is divided into at least two sub-frames each having a respective predefined duration, and wherein the timeframe corresponds to a time period between two scheduled refresh commands;
determine if a number of accesses for any of the rows during a first sub-frame of the at least two sub-frames exceeds a first threshold, the first threshold associated with risk of data corruption on a row physically adjacent to an accessed row;
throttle accesses to the accessed row at a first rate if the number of accesses to the accessed row exceeds the first threshold and not throttle accesses to the accessed row at the first rate if the number of accesses to the accessed row does not exceed the first threshold;
determine if a number of accesses for the accessed row during a second sub-frame of the at least two sub-frames exceeds a second threshold, wherein the second threshold is greater than the first threshold, throttle accesses to the accessed row at a second rate if the number of accesses to the accessed row exceeds the second threshold and not throttle accesses to the accessed row at the second rate if the number of accesses to the accessed row does not exceed the second threshold, wherein the second throttling rate is greater than the first throttling rate; and
generate a targeted refresh with a refresh command, other than either of the two scheduled refresh commands, to refresh only the row physically adjacent to the accessed row in response to one of the number of accesses for the accessed row during the first sub-frame exceeding the first threshold and the number of accesses for the accessed row during the second sub-frame exceeding the second threshold; and
a multicore processor coupled with the memory subsystem to access the memory subsystem during execution.

18. The electronic device of claim 17, wherein the memory controller to monitor access for the timeframe comprises the memory controller to monitor accesses for a time period equal to a refresh cycle time for the memory device.

19. The electronic device of claim 17 wherein the at least two sub-frames comprise three sub-frames where no throttling is performed during a first sub-frame, the first rate of throttling is selectively applied during a second sub-frame, and the second rate of throttling is selectively applied during a third sub-frame.

20. The electronic device of claim 19 wherein the first sub-frame comprises a first half of the timeframe, the second sub-frame comprises one quarter of the timeframe, and the third sub-frame comprises one quarter of the timeframe.

21. The electronic device of claim 19 wherein the first sub-frame comprises a first quarter of the timeframe, the second sub-frame comprises one quarter of the timeframe, and the third sub-frame comprises a last half of the timeframe.

22. The electronic device of claim 17, wherein the memory controller to monitor access further comprises the memory controller to maintain a table of access counts to monitor the accesses, and comparing the access counts to the first threshold and the second threshold.

23. The electronic device of claim 17 wherein the memory device conforms to a double data rate (DDR) standard.

24. The electronic device of claim 23 wherein the DDR standard comprises a DDR-4 standard.

* * * * *